United States Patent [19]

Mukai

[11] Patent Number: 4,551,907
[45] Date of Patent: Nov. 12, 1985

[54] PROCESS FOR FABRICATING A SEMICONDUCTOR DEVICE

[75] Inventor: Ryoichi Mukai, Kawasaki, Japan

[73] Assignee: Fujitsu Limited, Kawasaki, Japan

[21] Appl. No.: 554,544

[22] Filed: Nov. 23, 1983

[30] Foreign Application Priority Data

Nov. 30, 1982 [JP]  Japan ............................ 57-210133

[51] Int. Cl.[4] ...................... H01L 21/24; H01L 21/28
[52] U.S. Cl. ........................................ 29/571; 29/578; 29/589; 148/1.5; 357/67; 357/71; 427/88; 427/93
[58] Field of Search ................. 29/571, 578, 589, 590, 29/591; 148/1.5; 357/65, 67, 71; 427/88, 89, 90, 91, 93

[56] References Cited

U.S. PATENT DOCUMENTS

| | | | |
|---|---|---|---|
| 3,777,364 | 12/1973 | Schinella et al. | 29/590 X |
| 4,180,596 | 12/1979 | Crowder et al. | 427/93 X |
| 4,285,761 | 8/1981 | Fatula et al. | 29/571 X |
| 4,332,839 | 6/1982 | Levinstein et al. | 427/89 X |

OTHER PUBLICATIONS

Laibowitz et al., "Fabrication of Vias in a Multilayered Metallization in LSI Technology"; IBM Tech. Disc. Bull., vol. 21, No. 12, May 1979, pp. 5051–5052.

Shibata et al.; "Metal Silicon Reactions Induced by CW Scanned Laser and Electron Beams", J. Electrochem Soc.; vol. 128, No. 3, Mar. 1981, pp. 637–644.

Howard; "Gate for MOS Devices: Rare Earth Silicides"; IBM Tech. Disc. Bul., vol. 21, No. 7, Dec. 1978, pp. 2811–2813.

Rideout; "Reducing the Sheet Resistance of Polysilicon Lines in Integrated Circuits", IBM Tech. Disc. Bul., vol. 17, No. 6, Nov. 1974, pp. 1831–1833.

Primary Examiner—Brian E. Hearn
Assistant Examiner—David A. Hey
Attorney, Agent, or Firm—Staas & Halsey

[57] ABSTRACT

A metal silicide interconnection technique selectively forming a metal silicide layer on a silicon layer followed by heat treating the layers so that a surface silicon dioxide layer is formed and the metal silicide layer is forced down and is buried under the silicon dioxide layer. This silicon dioxide layer has an even top surface.

18 Claims, 6 Drawing Figures

PROCESS FOR FABRICATING A SEMICONDUCTOR DEVICE

BACKGROUND OF THE INVENTION

The present invention relates to metal silicide technology, more specifically to a process for fabricating a semiconductor device having metal silicide interconnections.

Efforts have been made to use metal silicides, in particular the, so-called "refractory silicides" such as molybdenum silicide ($MoSi_2$), and tungsten silicide ($WSi_2$), for interconnections in large-scale integrated circuits (LSI's), since they have a lower electrical resistance than that of polysilicon and a higher heat resistance than that of aluminum; polysilicon and aluminum being the material most widely used for interconnections in LSI's at present. Polysilicon will be repaced by metal silicides which have electrical resistances one order lower than that of polysilicon in LSI's in which the electrical resistance of the interconnection tends to increase as the degree of the integration of the LSI's are increased, since the interconnection lines may be longer and/or thinner.

When fabricating a metal silicide interconnection, a layer of metal silicide, e.g., $MoSi_2$, is formed over a substrate by, for example, a simultaneous sputtering (co-sputtering) method. The metal silicide layer is patterned by a conventional photolithography process. For example, a phospho-silicate-glass (PSG) layer is formed on the patterned metal silicide layer as an insulating layer between the conductive layers. A further conductive layer of, e.g., aluminum is formed on this insulating layer and is covered with another insulating layer. In such a prior art fabrication process, the metal silicide layer contains steep steps after it has been patterned, which may cause discontinuity in the insulating layer formed thereon, decreasing the quality of the insulation between the conductive layers formed on and under the metal silicide layer. The steep steps in the metal silicide layer may result in steps at the surface of the insulating layer formed on the metal silicide layer, which causes deterioration in the quality of the conducting lines formed on the insulating layer. Further, patterning of a metal silicide layer, e.g., $MoSi_2$, by a conventional photolithography technique is difficult and may damage an active layer under or below the metal silicide layer due to attacks by the ions during an anisotropic reactive ion etching, which is usually used for patterning metal silicide.

SUMMARY OF THE INVENTION

An object of the present invention is to provide an insulating layer on a patterned metal silicide layer, which has an even top surface.

Another object of the invention is to provide a process for fabricating a semiconductor device having such an insulating layer.

Still another object of the invention is to simplify a process for fabricating a semiconductor device having metal silicide interconnections.

These and other objects, features, and advantages are accomplished by a process for fabricating a semiconductor device, comprising the steps of: selectively forming a metal silicide layer on a silicon layer; effecting an oxidation procedure for the metal silicide layer and the silicon layer, so that a silicon dioxide layer is formed at the surface and the metal silicide layer is forced down and is buried under the silicon dioxide layer.

The metal silicide layer is preferably of a so-called "refractory metal silicide" such as $MoSi_2$, $WSi_2$, titanium silicide ($TiSi_2$), and tantalum silicide ($TaSi_2$). It may be of platinum silicide (PtSi) also.

It is known that a metal silicide layer will sink into a silicon layer existing just under the metal silicide layer when the layers are subjected to oxidation. This phenomenon occurs as follows: a silicon dioxide layer is formed at the surface of the metal silicide layer by bonding the oxygen from the enclosure with the silicon in the metal silicide layer. This bonding of oxygen with silicon frees some bonding bands of the metal which then bond with the silicon in the silicon layer existing just under the metal silicide layer. The above process is repeated during the oxidation procedure. As a result, a metal silicide layer is seen to sink into a silicon layer existing just under the metal silicide. A process for fabricating a semiconductor device according to the present invention uses this phenomenon and provides interconnections comprising a metal silicide layer and an insulating layer on the metal silicide layer, the insulating layer having an even top surface and excellent insulation properties. This process is relatively simple and should not have adverse effects on an active layer existing below the metal silicide layer.

In a process for fabricating a semiconductor device according to the present invention a silicon layer may preferably have a thickness of approximately 300 nm to 400 nm, resulting in a silicon dioxide layer approximately 600 nm to 800 nm thick. A metal silicide layer may preferably have a thickness of approximately 300 nm to 400 nm, in particular, approximately 300 nm. For example, a metal silicide layer 300 nm thick may be generally obtained from a metal layer approximately 100 nm thick if the metal silicide is represented by the formula $MSi_2$, wherein M is a metal, or from a metal layer approximately 150 nm thick if the metal silicide is represented by the formula MSi.

The selective forming of a metal silicide layer on a silicon layer may be conducted either by forming a selective metal layer on a silicon layer, followed by heat treating it to form a metal silicide layer on the silicon layer, or by forming a metal layer all over a silicon layer and selectively exposing the layer to a high energy beam to form a metal silicide layer over the respective parts of the silicon layer, followed by removing the remainder of the metal layer. It is preferable to etch some of the thickness of the silicon layer at the area where the selective metal silicide layer does not exist before effecting oxidation, so that the resultant oxidized layer has a thoroughly uniform thickness, giving an even top surface.

BRIEF DESCRIPTION OF THE DRAWINGS

These and other objects, features, and advantages of the present invention will be described below as examples with reference to the accompanying drawings, in which.

DESCRIPTION OF THE PREFERRED EMBODIMENTS

In accordance with the present invention, a semiconductor device comprising metal oxide semiconductor (MOS) transistors and MoSi$_2$ interconnections is fabricated.

Figure 1:
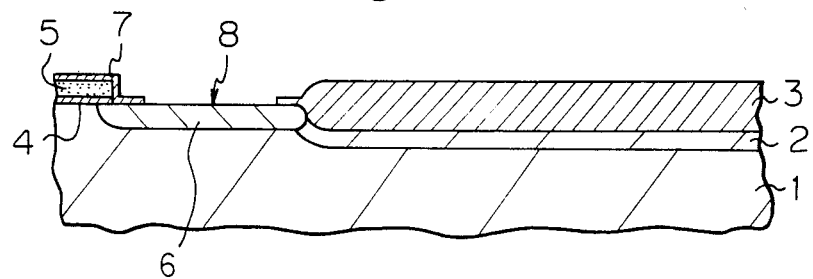
FIGS. 1, 2, 3a, 3b, 4 and 5 are sectional views of a part of a semiconductor device, each showing a step of a process according to the present invention.

Referring to FIG. 1, a MOS transistor is formed in and on a p-type silicon substrate 1. A p$^+$-type channel cut region 2 is selectively formed in and adjacent to the surface of the substrate 1 and the surface of the channel cut region 2 is then oxidized to form a field oxide layer 3, for element separation. A thin layer of the exposed surface of the substrate 1, i.e., that surface not covered by the field oxide layer 3, is oxidized to form a gate insulating film 4 of silicon dioxide. A gate 5 of polysilicon is formed on the silicon dioxide layer 4. An n$^+$-type drain region 6 and an n$^+$-type source region (not shown in the FIGS.) are formed by ion implantation using the gate 5 and the field oxide layer 3 as masks. The exposed surfaces of the gate 5 are then oxidized, and the silicon dioxide layer 4 on the source region (not shown) and the drain region 6 is selectively etched off to form electrode contact windows 8. The above description is of a conventional process.

Figure 2:
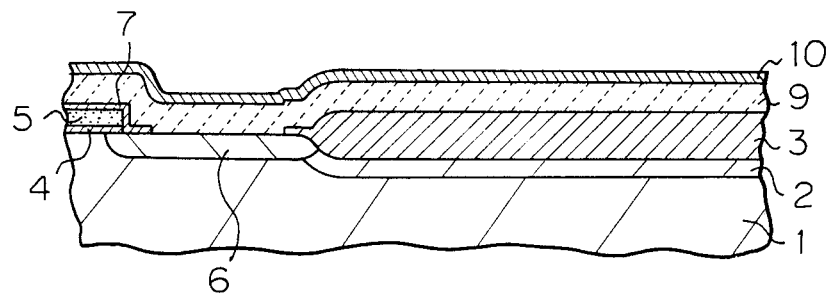

Referring to FIG. 2, a non-doped polysilicon layer 9 is deposited to a thickness of, e.g., 300 nm to 400 nm by a chemical vapor deposition (CVD) technique and a molybdenum (Mo) layer 10 is then deposited on the polysilicon layer 9 to a thickness of, e.g., 80 nm to 100 nm by an electron beam evaporation technique, or the like.

Figure 3A:
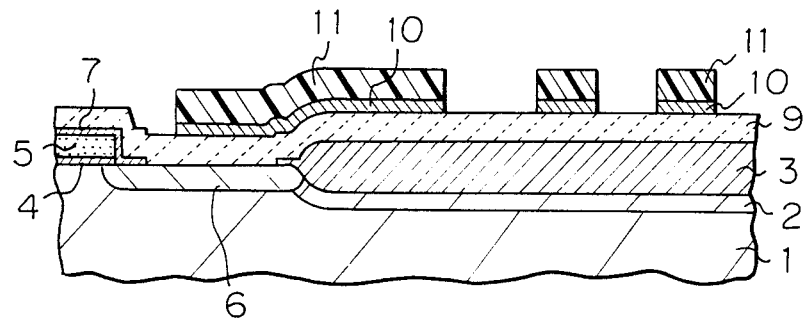

Referring to FIG. 3a, the Mo layer 10 is patterned by forming a resist layer 11 on the Mo layer 10, patterning the resist layer 11, and selectively etching the Mo layer 10 with a heated etchant of, e.g., phosphoric acid with 4 wt %-nitric acid, and the resist layer 11 acting as a mask. The resist layer 11 is then removed and heat treatment is effected at a temperature of approximately 550° C. for a period of, e.g., 20 minutes, to change the Mo layer 10 to an MoSi$_2$ layer 12. This MoSi$_2$ layer 12 is formed by the reaction between the molybdenum in the Mo layer 11 and the silicon in the polysilicon layer 9 and includes an upper part protruding from the surface of the original polysilicon layer 9, approximately 80 nm to 100 nm thick, and a lower part buried in the polysilicon layer 9, approximately 160 nm to 200 nm thick (see FIG. 4).

In general, the heat treatment mentioned above is conducted at a temperature of above approximately 500° C., preferably above 550° C., since the reaction for forming MoSi$_2$ occurs most frequently at such a temperature. Further, the temperature is preferably below approximately 1300° C. since the resultant surface of the MoSi$_2$ layer 12 is disturbed at a temperature near to the melting point of the polysilicon.

Figure 3B:
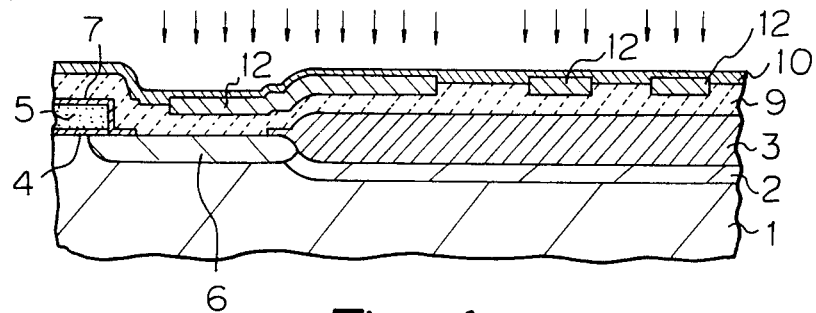
Figure 4:
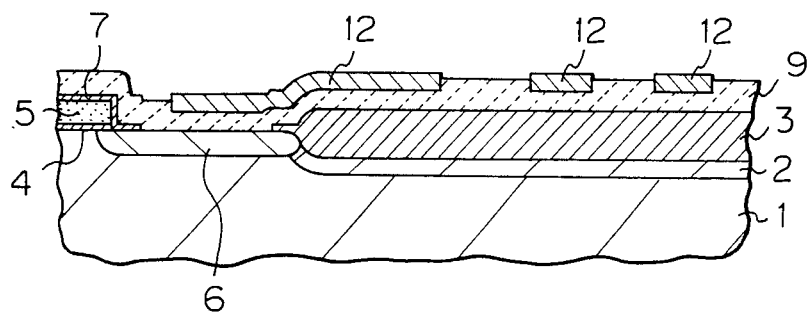

Selectively, the MoSi$_2$ layer 12 shown in FIG. 4 may be formed in a different way, as described below: referring to FIG. 3b, the Mo layer 10 mentioned before and shown in FIG. 2 is subjected to selective scanning with an energy beam, for example, a continuous wave laser beam, of a required intensity, to form a MoSi layer 12 at the interface of the Mo layer 10 and the polysilicon layer 9. When beam scanning by a continuous wave argon (CW-Ar) laser having a beam spot diameter of approximately 3.5 μ and an output of approximately 1.5 W is effected at a scanning speed of approximately 10 cm/sec, the resultant MoSi$_2$ layer 12 has a thickness of approximately 100 nm. Therefore, a plurality of scannings are needed to obtain an MoSi$_2$ layer having a larger thickness, for example, 300 nm. In such a case, it is preferable to heat a supporter on which the silicon wafer, i.e., the substrate 1, is mounted for beam scanning to a temperature of approximately 400° C. to 450° C. Lowering the scanning speed or increasing the output power of the laser may be done to decrease the number of scannings, but precautions should be taken that the melting point of the silicon is not exceeded.

By this process an MoSi$_2$ layer 12 having a thickness of approximately 240 nm to 300 nm is formed. A portion of the MoSi$_2$ layer 12 is buried in the silicon layer, to a depth of approximately two-thirds of the thickness of the MoSi$_2$ layer 12 itself. Electron beams, ion beams, or other high energy beams may be used for selectively forming the MoSi$_2$ layer 12 in place of the above laser beam. After the MoSi$_2$ layer 12 is formed, the remainder of the Mo layer 10 is removed by etching with a heated etchant of, e.g., phosphoric acid mixed with 4 wt%-nitric acid, resulting in exposure of the MoSi$_2$ layer 12 and the polysilicon layer 9 (see FIG. 4).

Figure 5:
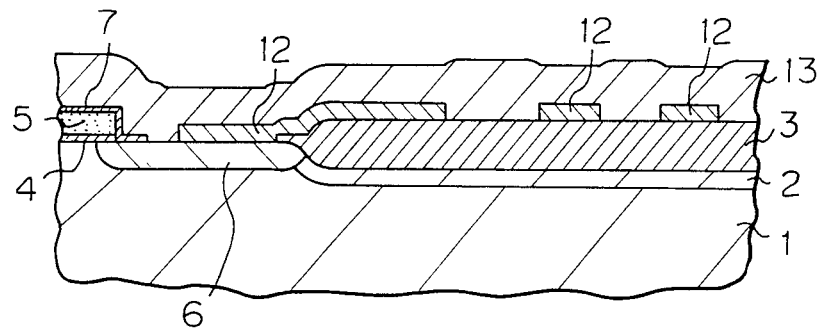

Referring to FIG. 5, following the selective formation of the MoSi$_2$ layer 12, oxidation of the MoSi$_2$ layer 12 and the polysilicon layer 9 is effected in a wet oxygen gas atmosphere at a temperature of, e.g., approximately 900° C. to 1000° C. for a required period, until the polysilicon layer 9 is oxidized from top to bottom. This oxidation procedure forces the MoSi$_2$ layer 12 to go down and reach the top surfaces of the field oxide layer 3 and the source region (not shown) and the drain region 6, the MoSi$_2$ layer 12 making contact with the source region and the drain region 6, the mechanism of this phenomenon having been described before. After this oxidation, the polysilicon layer 9 is changed to a silicon dioxide (SiO$_2$) layer 13, which is approximately twice as thick as the original polysilicon layer 9.

Where the original polysilicon layer 9 shown in FIG. 2 and the MoSi$_2$ layer 12 have a thickness of 300 nm and 240 nm, respectively, the resultant thickness of the SiO$_2$ layer 13 where the MoSi$_2$ layer 12 does not exist is approximately 600 nm, and the resultant total thickness of the SiO$_2$ layer 13 and the MoSi$_2$ layer 12 where the MoSi$_2$ layer 12 exists is approximately 520 nm. The difference in these two thicknesses is only 80 nm. Where the polysilicon layer 9 and the MoSi$_2$ layer 12 are 400 nm and 300 nm thick respectively, the resultant former and latter thicknesses are 800 nm and 700 nm, respectively, the difference being 100 nm. Thus, the resultant layer consisting of the SiO$_2$ layer 13 and the MoSi$_2$ layer 12 has a substantially uniform thickness and, therefore, a substantially even top surface.

Selective etching of the polysilicon layer 9 to a certain thickness by using the MoSi$_2$ layer 12 as a mask may be effected after the MoSi$_2$ layer 12 is selectively formed on the polysilicon layer 9, so that the resultant layer consisting of the SiO$_2$ layer 13 and the MoSi$_2$ layer 12 after oxidation has a theoretically uniform thickness, resulting in an even top surface.

The thus obtainable even top surface of the SiO$_2$ *layer 13, i.e., an insulating layer, is extremely advantageous in that an excellent conductive layer can be easily formed on the insulating layer. Further, the resultant SiO$_2$* layer 13 is an excellent insulating layer since it is not formed onto an MoSi$_2$ layer 12 originally having steps, as in the prior art. In a process according to the present invention, an active region such as the source or drain region in the above-described example is not damaged from sputtering, as in a conventional process. In addition, patterning of a layer of metal silicide such as MoSi$_2$ is simple if it is effected by a high energy beam.

It should be noted that the above description is made with reference to examples, and the present invention is not limited to these examples. For example, the MoSi$_2$ layer 12 may be formed onto a phospho-silicate-glass (PSG) layer, or the like other than a field oxide layer. The polysilicon layer on which a metal silicide layer is formed, and which should be oxidized, may be replaced by a single crystalline silicon layer. A process according to the present invention may also apply to other metal silicides such as $WSi_2$, $TiSi_2$, $TaSi_2$, and PtSi.

I claim:

1. A process for fabricating a semiconductor device, comprising the steps of:

forming a silicon layer on a substrate;

forming a metal silicide layer on only a portion of the surface of the silicon layer, with the remaining portion of said surface of the silicon layer being uncovered by the metal silicide layer; and oxidizing both the metal silicide layer and said portion of the silicon layer which is not covered by the metal silicide layer, in a direction from the top surface to the inside thereof;

wherein the silicon layer is entirely converted to a silicon dioxide layer and the metal silicide layer sinks in said silicon layer to said substrate.

2. A process according to claim 1, wherein the metal silicide layer is selected from a group consisting of $MoSi_2$, $WSi_2$, and $TaSi_2$.

3. A process according to claim 1, wherein the metal silicide layer is of PtSi.

4. A process according to claim 1, wherein the metal silicide layer is formed in a thickness of 240 nm to 300 nm.

5. A process according to claim 1, wherein the silicon layer is formed in a thickness of 300 nm to 400 nm.

6. A process according to claim 1, wherein, after the step of forming a metal silicide layer, an additional step is inserted, the additional step being that of etching the surface of the silicon layer except where the metal silicide layer covers the respective portion of the silicon layer, so that, after the oxidation step, the resultant layer consisting of the silicon dioxide layer and the metal silicide layer has a uniform thickness.

7. A process according to claim 1, wherein the silicon layer is formed with a sufficient thickness and is subsequently etched to a thickness of 40 nm to 50 nm before said oxidation step.

8. A process according to claim 1, wherein the step of forming said metal silicide layer comprises selectively forming a layer of the respective metal on said silicon layer and then heat treating said metal and silicon layers to form said metal silicide layer on the silicon layer.

9. A process according to claim 1, wherein the step of forming said metal silicide layer comprises forming a layer of the respective metal over said silicon layer, selectively exposing said metal and silicon layer to a high energy beam to form said metal silicide layer, and removing the remainder of the metal layer.

10. The process of claim 1, wherein said oxidation step comprises oxidation in a wet oxygen gas atmosphere.

11. The process of claim 1, wherein said oxidization step and the thickness of said layers are controlled such that all of said silicon layer is oxidized, except for the silicon of the sunken metal silicide layer, and said metal silicide layer is located beneath said silicon dioxide layer.

12. The process of claim 6, wherein said oxidation step and the thickness of said layers are controlled such that all of said silicon layer is oxidized, except for the silicon of the sunken metal silicide layer, and said metal silicide layer is located beneath said silicon dioxide layer.

13. The process of claim 7, said oxidation step being performed and said layers being formed with respective thicknesses such that all of said silicon layer is oxidized, except for the silicon of the sunken metal silicide layer, and said metal silicide layer is located beneath said silicon dioxide layer.

14. The process of claim 9, said high energy beam being a laser beam.

15. A process according to claim 1, wherein said metal silicide layer is formed by forming a layer of said metal on said silicon layer, and then reacting said metal with said silicon of said silicon layer only in the respective portion of the silicon layer where said metal silicide layer is to be formed.

16. A process according to claim 15, wherein said metal layer is patterned to remain only on the respective portion of said silicon layer where said metal silicide layer is to be formed, and heat treatment is then effected to form said metal silicide.

17. A process according to claim 15, wherein said metal layer is exposed to a high energy beam only on said portion of said silicon layer where said metal silicide layer is to be formed, thus forming said metal silicide layer, and the remaining metal of said metal layer is then etched.

18. A process according to claim 15, wherein after said metal silicide layer is formed, the uncovered surface of said silicon layer is selectively etched to a thickness such that after said oxidation the resultant layer of said silicon dioxide layer and said metal silicide layer on said substrate has a uniform thickness.

* * * * *

UNITED STATES PATENT AND TRADEMARK OFFICE
CERTIFICATE OF CORRECTION

PATENT NO. : 4,551,907
DATED : November 12, 1985
INVENTOR(S) : Ryoichi Mukai

It is certified that error appears in the above-identified patent and that said Letters Patent is hereby corrected as shown below:

Column 1, line 12, "the," should be --the--;
line 17, "aluminum;" should be --aluminum,--.

Column 3, line 50, delete "to".

Signed and Sealed this

Twenty-fifth Day of February 1986

[SEAL]

Attest:

DONALD J. QUIGG

Attesting Officer

Commissioner of Patents and Trademarks